US008288823B2

United States Patent
Ernst et al.

(10) Patent No.: US 8,288,823 B2
(45) Date of Patent: Oct. 16, 2012

(54) DOUBLE-GATE TRANSISTOR STRUCTURE EQUIPPED WITH A MULTI-BRANCH CHANNEL

(75) Inventors: Thomas Ernst, Morette (FR); Cecilia Dupre, Grenoble (FR)

(73) Assignee: Commissariat A L'Energie Atomique, Grenoble (FR)

( * ) Notice: Subject to any disclaimer, the term of this patent is extended or adjusted under 35 U.S.C. 154(b) by 394 days.

(21) Appl. No.: 12/238,794

(22) Filed: Sep. 26, 2008

(65) Prior Publication Data
US 2009/0085119 A1    Apr. 2, 2009

(30) Foreign Application Priority Data
Sep. 28, 2007    (FR) ........................................ 07 57960

(51) Int. Cl.
*H01L 29/66* (2006.01)
(52) U.S. Cl. ................. 257/365; 257/241; 257/E29.134
(58) Field of Classification Search .................. 257/331, 257/241, 365, 341, 342, E29.129, E29.13, 257/E29.131, E29.134, E29.262, E29.264
See application file for complete search history.

(56) References Cited

U.S. PATENT DOCUMENTS

| | | | |
|---|---|---|---|
| 5,675,164 A | 10/1997 | Brunner et al. | |
| 5,780,911 A | 7/1998 | Park et al. | |
| 5,965,914 A | 10/1999 | Miyamoto | |
| 6,211,531 B1 * | 4/2001 | Nakazato et al. | 257/28 |
| 6,355,532 B1 | 3/2002 | Seliskar et al. | |
| 6,413,802 B1 | 7/2002 | Hu et al. | |
| 6,562,665 B1 | 5/2003 | Yu | |
| 6,720,702 B2 | 4/2004 | Knauff | |
| 6,762,448 B1 | 7/2004 | Lin et al. | |
| 6,787,402 B1 | 9/2004 | Yu | |
| 6,855,588 B1 | 2/2005 | Liao et al. | |
| 6,911,697 B1 | 6/2005 | Wang et al. | |
| 2002/0093053 A1 | 7/2002 | Chan et al. | |
| 2004/0063286 A1 | 4/2004 | Kim et al. | |

(Continued)

FOREIGN PATENT DOCUMENTS
FR    2 861 501 A1    4/2005
(Continued)

OTHER PUBLICATIONS

J.P Colinge et al: "Future of SOI Technology and Devices", Extended Abstracts of the International Conference on Solid State Devices and Materials, Japan Society of Applied Physics, Tokyo, JA, vol. 2001, Sep. 26, 2001.

(Continued)

*Primary Examiner* — Matthew Landau
*Assistant Examiner* — Candice Chan
(74) *Attorney, Agent, or Firm* — Pearne & Gordon LLP

(57) ABSTRACT

Double gate transistor microelectronic device comprising:
a support,
a structure suited to forming at least one multi-branch channel and comprising a plurality of separate parallel semi-conductor rods and situated in a plane orthogonal to the principal plane of the support, the rods linking a first block suited to forming a source region of the transistor and a second block provided, suited to forming a drain region of the transistor,
a first gate electrode situated on one side of said structure against the sides of said semi-conductor rods,
a second gate electrode, separate from the first gate and situated on another side of the structure against the opposite sides of the rods, the semi-conductor rods and one or several insulating rods situated between the semi-conductor rods, separating the first gate electrode and the second gate electrode.

12 Claims, 8 Drawing Sheets

U.S. PATENT DOCUMENTS

| | | |
|---|---|---|
| 2004/0092060 A1 | 5/2004 | Gambino et al. |
| 2004/0262690 A1 | 12/2004 | Coronel et al. |
| 2005/0094434 A1 | 5/2005 | Watanabe et al. |
| 2005/0161739 A1 | 7/2005 | Anderson et al. |
| 2005/0285186 A1 | 12/2005 | Fujiwara et al. |

FOREIGN PATENT DOCUMENTS

| | | |
|---|---|---|
| WO | 2004/107399 A2 | 12/2004 |
| WO | 2005/010994 A1 | 2/2005 |
| WO | 2006/087381 A1 | 8/2006 |
| WO | 2006/108987 A1 | 10/2006 |

OTHER PUBLICATIONS

French Search Report for FR 0757960.

M. Terauchi: "A Novel 4T SRAM Cell Using "Self-Body-Biased" SOI MOSFET Structure Operating at 0;5 Volt.", IEEE Int. SOI Conf. pp. 108-109, 2000.

W. Hansch et al: "Carrier Transport Near the Si/SiO2 Interface of a MOSFET", Sol. State Elec., p. 839, 1989.

A. Tsormpatzoglou et al: "Semi-Analytical Modeling of Short Channel Effects in Si adn Ge Symmetrical Double-Gate MOSFETs", IEEE Transactions on Electron Devices, vol. 54, n 8, p. 1943, 2007.

H.K. Lim and J.G. Fossum: Theshod Voltage of Thin-Film Silicon-on-Insulator (SOI) MOSFETs, IEEE Transactions on Electron Devices, vol. 30, p. 1244, 1983.

Sung-Young Lee et al: "A Novel MCB (Multi-Bridge-Channel) MOSFET: Fabrication Technologies and Characteristics", IEEE Transactions on Nanotechnology, vol. 2, n 4, Dec. 2003.

Sung-Young Lee et al: "Sub-25nm Single-Metal Gate CMOS Multi-Bridge-Channel MOSFET (MBCFET) for High Performance and Low Power Application", 2005 Symposium on VLSI Technology Digest of Technical Papers, pp. 154-155.

* cited by examiner

DOUBLE-GATE TRANSISTOR STRUCTURE EQUIPPED WITH A MULTI-BRANCH CHANNEL

TECHNICAL FIELD

The present invention relates to the field of microelectronic devices equipped with double-gate transistors and concerns a double gate multi-branch channel transistor structure, as well as a method for producing said structure.

PRIOR ART

A conventional transistor structure is generally formed, on a substrate, for example of SOI type (SOI for "silicon on insulator"), of a source region and a drain region, for example in the form respectively of a first and second semi-conductor zones, linked together by a third semi-conductor structure intended to play the role of one channel or several channels in which a current is intended to flow, and which may have a shape of a semi-conductor block or a rod or a wire. This semi-conductor rod is covered with a gate electrode enabling the intensity of a current transiting in the channel or, if appropriate, in the channels between the source region and the drain region to be controlled.

The formation of double-gate transistors equipped with two independent gates that have symmetrical electrical characteristics or an identical behaviour for a same biasing is known. Double-gate transistors is taken to mean that these transistors comprise a separate first zone of gate material and a second zone of gate material, formed on either side of an active zone, wherein the first gate and the second gate are connected or not to each other.

Double-gate transistors may be formed according to a structure formed of a first gate and a second gate, arranged in such a way that the first gate, a semi-conductor zone intended to form a channel, and the second gate, are superimposed on a substrate.

Double-gate transistors may also be formed according a structure of type known as "finFET". In this type of transistor, the double-gate is formed of a first gate 4 and a second gate 8, arranged so that the first gate 4, a semi-conducting zone 6 of critical dimension $d_1$ and of height $h_1$ intended to form a channel, and the second gate 8, are juxtaposed on a substrate.

Document WO 2004/107399 discloses for example an independent double-gate finFET type MOS transistor structure, used in SRAM memories.

Such a structure generally necessitates the formation of thin films, the thickness of which is difficult to control.

The problem is posed of finding a novel double-gate transistor structure.

DESCRIPTION OF THE INVENTION

The invention firstly concerns a double gate transistor microelectronic device comprising:
a support,
a structure suited to forming at least one multi-branch channel of the transistor and comprising a plurality of separate parallel semi-conductor rods and situated in a plane orthogonal or substantially orthogonal to the principal plane of the support, the rods linking a first block suited to forming a source region of the transistor and a second block suited to forming a drain region of the transistor,
a first gate electrode situated on one side of said structure against the sides of said semi-conductor rods,
a second gate electrode, separate from the first gate and situated on another side of the structure against the opposite sides of the rods, the semi-conductor rods and one or several insulating rods situated between the semi-conductor rods separating the first gate electrode and the second gate electrode.

Such a structure enables improvements in terms of immunity to the phenomena of DIBL and integration density, compared to known double-gate transistor structures.

Such a structure also enables a coupling to be obtained between the gates.

A voltage modulation of the threshold voltage between the different channels can be implemented.

The insulating rods situated between the semi-conductor rods have a critical dimension or a width Wes less than the critical dimension or the width Wsi of the rods.

This can enable the gate electrodes to penetrate under and over a part of the semi-conductor rods and thereby have a better electrostatic control of the channel.

The ratio between the critical dimension Wsi of the semi-conductor rods and the critical dimension Wes of the insulating rods may be provided as a function of at least one predetermined maximum DIBL factor threshold $DIBL_{max}$ or barrier lowering, and/or at least one predetermined minimum coupling factor threshold $\alpha_0$ between the two gate electrodes.

The insulating rods may have a critical dimension Wes between 0.2 Wsi and 1*Wsi, where Wsi is the critical dimension of the semi-conductor rods.

The semi-conductor rods may have a critical dimension Wsi and tsi such that $w_{Si}/t_{Si}$ is comprised between 0.5 and 2.5, with Wsi where Wsi is the critical dimension of the semi-conductor rods and tsi the thickness of the semi-conductor rods.

The semi-conductor rods may have a critical dimension between 5 nm and 100 nm.

According to one embodiment possibility, the first gate electrode and the second gate electrode may moreover be separated by at least one insulating masking block, lying on said multi-branch channel structure.

The device may also comprise at least one insulating rod separating the semi-conductors rods of the support.

The invention also concerns a method for producing one or the other of the devices that have just been defined.

The present invention concerns in particular a method for producing a double gate transistor microelectronic device comprising the steps of:
forming, from a stacking of thin films on a support, the stacking comprising an alternation of layers based on at least one first semi-conductor material, and layers based on at least one second semi-conductor material, different from said first semi-conductor material, a plurality of superimposed aligned semi-conductor rods situated in a plane orthogonal to the principal plane of the support,
removing the rods based on first semi-conductor material,
forming one or several insulating rods between the rods based on the second semi-conductor,
forming a first gate against the sides of the rods and a second gate separate from the first gate against the opposite sides of the rods, the semi-conductor rods and the insulating rods separating the first gate and the second gate.

The insulating rods situated between the semi-conductor rods may have a critical dimension Wes less than the critical dimension Wsi of the semi-conductor rods.

The ratio between the critical dimension Wsi of the semi-conductor rods and the critical dimension Wes of the insulating rods may be provided as a function of at least one predetermined maximum DIBL factor threshold and/or at least one predetermined minimum coupling factor threshold between the two gate electrodes.

The insulating rods may have a critical dimension Wes between 0.2*Wsi and Wsi.

The semi-conductor rods may have a critical dimension between 5 and 100 nm.

The formation of said insulating rods may comprise steps of:
depositing at least one first dielectric material around the rods based on the second semi-conductor material,
depositing at least one second dielectric material,
selective and partial removal of the second dielectric material with regard to the first dielectric material.

At least one of said insulating rods may be situated between the support and said semi-conductor rods.

The stacking may be covered with an insulating masking. The formation of said insulating rods may then comprise the formation from said insulating masking, of at least one insulating rod between said semi-conductor rods and said insulating masking.

According to one possibility, the formation of the gates may comprise the deposition of a gate material, as well as the polishing of the gate material up to the level of said insulating rod situated above said semi-conductor rods.

A separation of the two gates may be achieved by polishing, or by polishing then etching, for example by anisotropic plasma etching.

BRIEF DESCRIPTION OF DRAWINGS

The present invention will be better understood on reading the description of embodiments given solely by way of indication and in no way limiting and by referring to the appended figures in which.

Identical, similar or equivalent parts of the different figures bear the same number references so as to make it easier to go from one figure to the next.

In order to make the figures more legible, the different parts represented in the figures are not necessarily to a uniform scale.

DETAILED DESCRIPTION OF SPECIFIC EMBODIMENTS

An example of microelectronic device according to the invention will now be given in relation to FIG. 2.

This device firstly comprises a substrate 100, which may be of semi-conductor or semi-conductor on insulator type, for example of SOI type (SOI for "Silicon On Insulator") or of SiGeOI type (SiGeOI for "SiGe On Insulator"), and equipped notably with a first mechanical support layer 101, which may be based on semi-conductor material, for example based on silicon, as well as, advantageously, an insulating 102 or buried oxide layer for example based on $SiO_2$, lying on the first layer 101. In the case where the substrate is in the form of a semi-conductor layer, the superficial layer of said substrate may be doped in an opposite manner to the doping provided for the source and drain regions in order to achieve a partial electrical insulation of "reverse polarised junction" type between these two regions. For example, the superficial layer may be N-type doped in the case of a PMOS type transistor.

Figure 2:
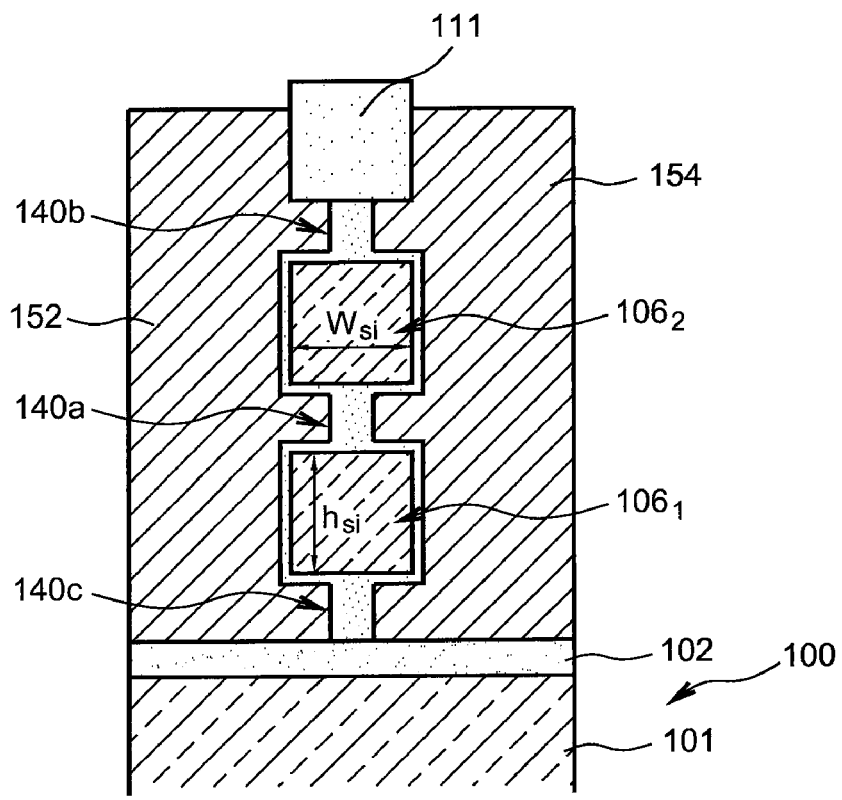
FIG. 2 illustrates an example of double-gate vertical multi-channel or multi-branch channel transistor structure according to the invention.

The layer 102 serves as support for a first block and a second block (not represented), intended to form respectively, a transistor drain region, and a transistor source region, and linked to each other through the intermediary of several rods or stems or wires, for example, as shown by FIG. 2, by two semi-conductor rods $106_1$, $106_2$. The rods $106_1$, $106_2$, are parallel to each other and situated in a plane orthogonal or substantially orthogonal to the principal plane of the substrate (defined in this figure by a plane passing for example through the layer 101 and parallel to the plane [o; $\vec{i}$; $\vec{k}$].

The rods $106_1$, $106_2$, are provided to form a multi-branch transistor channel structure also known as "multi-channel".

The rods $106_1$, $106_2$, link in the sense of their length (defined in FIG. 2 in a direction parallel to the vector $\vec{k}$ of an orthogonal mark [o; $\vec{i}$; $\vec{j}$; $\vec{k}$]), one face of the first block, and one face of the second block. The length of the rods $106_1$, $106_2$, which also corresponds to a distance separating the source and drain blocks, may be for example between 10 nanometers and 1000 nanometers, or be for example around 50 nanometers.

The rods $106_1$, $106_2$, also have a width or critical dimension Wsi (measured in a direction parallel to the vector $\vec{i}$ of the orthogonal mark [O; $\vec{i}$; $\vec{j}$; $\vec{k}$]) which may be between 5 nanometers and 50 nanometers, preferably between 10 nanometers and 25 nanometers, for example around 10 nanometers.

The rods $106_1$, $106_2$, also have a height hsi (measured in a direction parallel to the vector $\vec{j}$ of the orthogonal mark [O; $\vec{i}$; $\vec{j}$; $\vec{k}$]) which may be between 5 nanometers and 25 nanometers, preferably between 0.7*Wsi and 1.3*Wsi, where Wsi is the width of the semi-conductor rods. Thus the height of the rods hsi may be provided as a function of the width that said rods are conferred with.

The rods $106_1$, $106_2$ of the microelectronic device may have been formed so as not to be in contact with the support on which the source and drain blocks lie. In the example illustrated by FIG. 2, the rods $106_1$, $106_2$, are not in contact with the layer 102 of the substrate 100.

The rods $106_1$, $106_2$, are insulated from each other through the intermediary of insulating spacers such as that referenced 140a. The insulating spacers may also be in the form of rods based on dielectric material and have a width or a critical dimension Wes (measured in a direction parallel to the vector $\vec{i}$ of the orthogonal mark $[O; \vec{i}; \vec{j}; \vec{k}]$) which may be between 5 nanometers and 100 nanometers, preferably between 0.2*Wsi and 1*Wsi, or be for example 10 nm.

The insulating spacers are provided with a width or critical dimension Wes less than that Wsi of the semi-conductor rods $106_1$, $106_2$, and adjusted as a function of characteristics such as the coupling between the gate electrodes of the double gate, and immunity to the effects of barrier lowering or DIBL that it is planed to confer on the structure.

For a width Wsi of the semi-conductor rods around 25 nm, a height hsi of the semi-conductor rods around 25 nm and a width Wes of the insulating rods between 5 nm and 15 nm, a DIBL less than 80 mV/V and a coupling greater than 0.15 may be obtained.

The insulating spacer may also have a thickness hes (measured in a direction parallel to the vector $\vec{j}$ of the orthogonal mark $[O; \vec{i}; \vec{j}; \vec{k}]$) which may be between 4 nanometers and 100 nanometers and be for example around 30 nanometers.

The transistor comprises a double-gate formed of a first gate electrode 152 and a second gate electrode 154, insulated from the first gate electrode 152. The two gate electrodes 152, 154 lie on the insulating layer 102 of the substrate and are separated from each other through the intermediary of the multi-branch channel structure and the insulating spacers 140a, 140b, 140c.

An insulating spacer 140b may be notably provided above the semi-conductor rods $106_1$, $106_2$ to insulate the two gates from each other.

Another insulating spacer 140c may be provided below the semi-conductor rods $106_1$, $106_2$, between the semi-conductor rods $106_1$, $106_2$, and the substrate in order to insulate the two gates from each other.

A gate dielectric layer of thickness around several nanometers, for example around 2 nanometers, may also be provided.

The device may if necessary comprise an insulating hard mask 111 above the rods and at least one part of which reproduces the shape of said rods. The hard mask 111 may also serve as electrical insulation between the two electrodes 152, 154, of the double-gate.

The insulating spacers 140a, 140b, 140c have a width Wes provided so that the gate material of the electrodes 152, 154 of the double-gate penetrates between the semi-conductor rods.

The critical dimension Wes of the insulating rods 140a, 140b, 140c, and that Wsi of the semi-conductor rods $106_1$, $106_2$, may be chosen at least as a function of a DIBL factor (DIBL for "Drain Induced Barrier Lowering") and in particular a predetermined DIBL threshold noted DIBLmax, which may be around 100 mV/V that it is planed not to exceed when the transistor is operating. The DIBL is the reduction factor of the threshold voltage of the transistor due to the lowering of potential of the channel of the transistor due to the biasing of the drain electrode.

The critical dimension Wes of the insulating rods 140a, 140b, 140c, and that Wsi of the rods $106_1$, $106_2$, may also be chosen at least as a function of a coupling factor α between the two gates that it is wished to establish, and in particular a minimum coupling threshold $α_{min}$ (chosen as a function of the targeted application), which may be for example around 0.15 and that it is wished to exceed. The coupling may make it possible for example to control the threshold voltage of the conduction channel situated underneath one gate by the other gate, by electrostatic action.

Preferably, the dimensions of the semi-conductor and insulator rods are chosen so as to obtain a coupling factor α preferably above a threshold $α_0$ that may be for example around 0.15, wherein the value of this threshold may be modulated as a function of the targeted application.

A compromise between firstly the coupling factor α between the two gates 152, 154 and secondly the DIBL factor may be obtained by choosing the ratio Wes/Wsi of the width of the semi-conductor rods over the width of the insulating rods.

The Wes/Wsi ratio may be between 0.2 and 1, preferably between 0.2 and 0.9 and be for example around 0.5.

Figure 1:
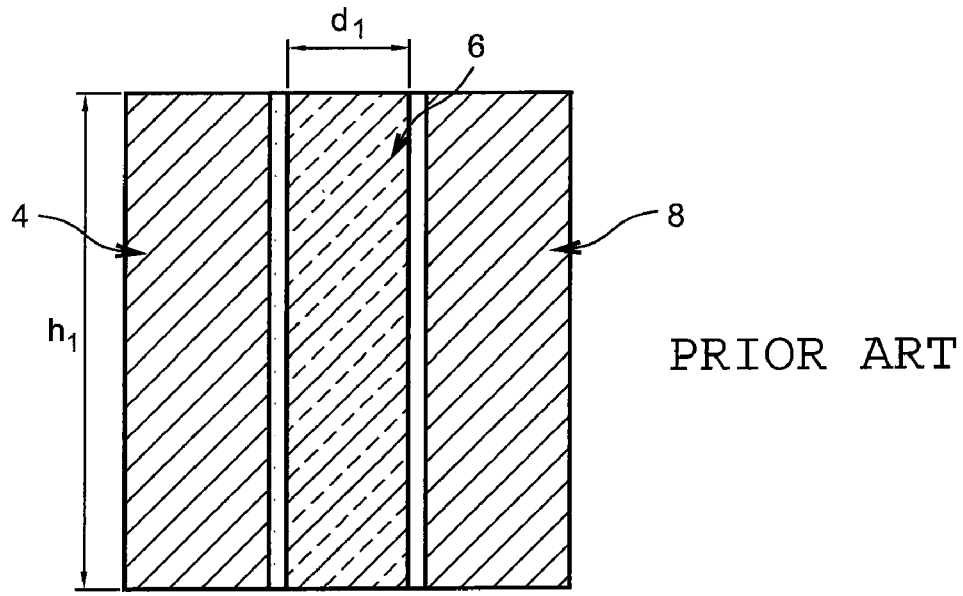
FIG. 1 illustrates an example of transistor structure according to the prior art.

A comparison between the finFET architecture according to the prior art, as described in FIG. 1, and a device according to the invention as illustrated in FIG. 2, in terms of DIBL, of coupling coefficient α, may be made. To do this, different simulation tools may be used. Partial differential equation resolution tools by finite elements may also be used, for example such as a flexPDE type simulation tool of the PDE Solutions Inc. company. Several physical and geometric parameters of the structures may be adjusted to perform these simulations, particularly the width of the semi-conductor rod(s), the thickness of the semi-conductor rod(s), the width of the insulating spacer(s), as well as the permittivity of these spacers. Conditions at the limits may be applied so as to simulate a substrate placed at a potential of 0V.

To perform a simulation of the behaviour of the structure according to the invention, different voltages may be applied to the dielectric zone of the first gate electrode and to the dielectric zone of the second gate electrode. It is possible to perform the simulation by describing the case of a metal gate, or to describe the depletion in the gate material in the case of a gate in semi-conductor material, for example based on doped poly Si.

In the other zones a condition at the "open" limits, in other words a gradient of zero potential may be applied. A quantic correction as disclosed in the document "Carrier transport near the Si/SiO$_2$ interface of a MOSFET" of Hänsch et al., Solid-state electronics (Solid-state electron.) ISSN 0038-1101, 1989, may be applied, in order to take account of the repulsion of the carriers of the channel/gate dielectric interface. Other methods may be used in order to take into account this quantic repulsion such as for example the resolution of the Schrödinger equation coupled to the Poisson equation. In order to verify the effects of short channels of these architectures, a 3D extrusion may be performed. A diffusion voltage Vbi=(kT/q)*ln(Na*Nd/ni$^2$) may be introduced in order to simulate for example a potential barrier of a p channel/n+ drain junction, for example for an N-type transistor. The extraction of the effects of short channels may be made in the following manner: The Poisson equation may be introduced, which may be written assuming that all of the donors and acceptors in the semi-conductor material are ionised:

$$\nabla^2 V = (e/\in)*(N_a - N_d + n - p) \quad (1)$$

where V is the potential, Na the density of acceptors and Nd the density of donors, n and p the free carrier density. If the case of a P-type semi-conductor is taken, Nd may be disregarded given Na, whereas n and p are expressed as a function of the potential:

$$n = Nd \exp(qV/kT)$$

$$\text{and } Nd = ni^2/Na \quad (2)$$

$$\text{Where } p = Na^* \exp(-qV/kT) \quad (3)$$

If it is aimed to evaluate the effects of short channels in the first instance, n and p may be disregarded given Na in the right hand term of the equation (1). Nd may be disregarded given Na in the case of a P-type semi-conductor.

By integrating $n = Nd\exp(qV/kT)$ on the volume of the semi-conductor material, it is possible to deduce the inversion charge Qis and therefore the current underneath the threshold for the long channel transistors:

$$I_{Dlong} = ((WkT)/(Lq))\mu_{eff}^* Q_{is}(1 - e^{-qVD/kT}) \quad (4)$$

Where W is the width of the channel,

L is the length of the channel, $\mu_{eff}$ is the effective mobility, $Q_{is}$ is the inversion charge in the channel per source side surface unit, q is the charge of the electron, T is the temperature in Kelvins and, k is the Boltzmann constant.

It is possible to deduce from this the current in a short channel by correcting by a corrective factor FC as disclosed in the document: Andreas Tsormpatzoglou, et al., Analytical modelling of short channel effects in Si sub-30 nm symmetrical gate-all-around MOSFETs, Proc. of ULIS Conf. 2007.

$$ID = IDLong/FC,$$

$$\text{where } FC = (1/vol) \int \exp(-q(V - V1))/kT.$$

Where Vol is the volume of the channel,

V and V1, the potentials in the channel in the case of a short and long device respectively.

This method enables the current in a long transistor and in a short transistor to be simply evaluated. The effects of short channels of the different architectures may be deduced from this. Other methods may be used to evaluate these currents such as for example introducing current equations with the drift-diffusion model.

From the evaluated currents, it is possible to deduce the following parameters such as the threshold voltage of the device, the slope underneath the threshold, and DIBL: Drain Induced Barrier Lowering, in other words the lowering of the potential on the drain side due to the biasing of the drain.

The coupling between the gates of a structure according to the invention may also be evaluated by simulation. The threshold voltage may be evaluated by the constant current extraction method.

Figure 4:
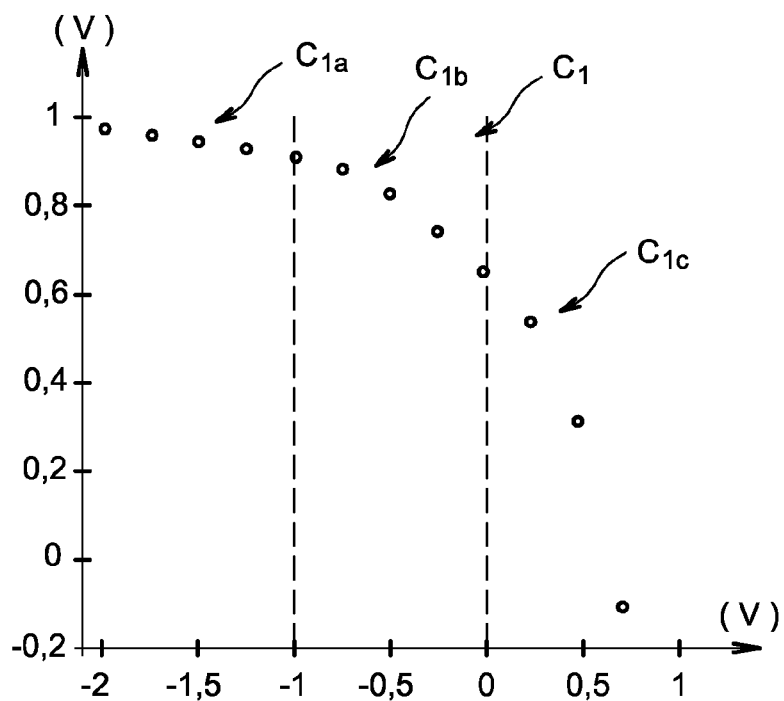
FIG. 4 illustrates, through the intermediary of a curve obtained by numerical simulations, the coupling between the two gates of a double-gate multi-branch transistor structure according to the invention.

An example of evaluating the coupling coefficient between the gates 152 and 154 of the structure is given in FIG. 4. In this figure, a curve $C_1$, representative of the threshold voltage of the first gate electrode 152, as a function of a voltage applied to the second gate electrode, for different regimes of biasing of the second gate electrode 154 of the transistor (accumulation on the portion $C_{1a}$ of curve $C_1$, depletion on the portion $C_{1b}$ of curve $C_1$, and inversion on the portion $C_{1c}$ of curve $C_1$), is given. Such a curve may be obtained by means of a constant current extraction method for a structure of dimensions Wsi=10 nm, hsi=10 nm, Wes=4 nm. From the slope of the portion $C_{1b}$ of curve $C_1$, the coupling coefficient between the gates may be extracted.

Figure 5:
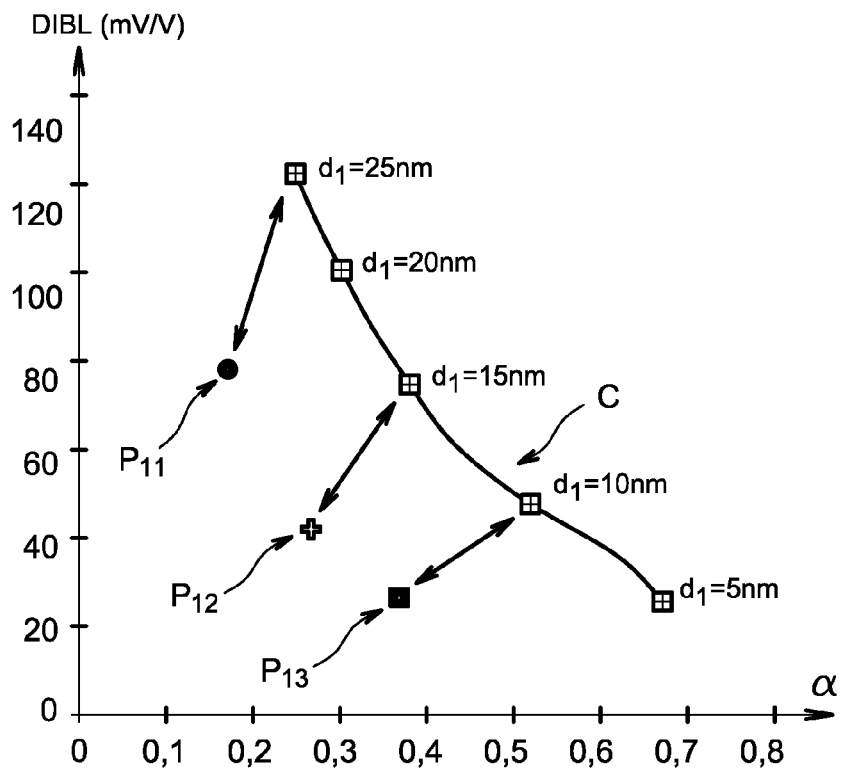
FIG. 5 illustrates, through the intermediary of numerical simulation curves, a comparison of the performances in terms of couple: DIBL factor/coupling factor, between a double-gate transistor structure according to the invention, and a finFET transistor structure according to the prior art, as a function of the respective critical dimensions of their channels.

In FIG. 5, examples of measurements (points $P_{11}, P_{12}, P_{13}$) of the DIBL factor/coupling factor $\alpha$ couple, are given for a double-gate transistor structure according to the invention, as described previously in relation to FIG. 2 as a function of dimensions Wsi, hsi, of the semi-conductor rods, and Wes, hes, of the insulating rods. The point $P_{11}$, has been obtained with the dimensions Wsi=hsi=25 nm, and Wes=hes=15 nm, whereas the point $P_{12}$, has been obtained with the dimensions Wsi=hsi=15 nm, and Wes=hes=7 nm, and the point $P_{13}$, has been obtained with the dimensions Wsi=hsi=10 nm, and Wes=hes=4 nm.

By way of comparison, in this FIG. 5, an example of curve $C_{10}$ representative of the DIBL factor/coupling factor $\alpha$ couple, is given for a finFET double-gate transistor structure according to the prior art, as described previously in relation to FIG. 1 as a function of the critical dimension $d_1$ of its channel varying between 5 and 25 nanometers and a height $h_1$ of its channel around 200 nanometers. In this figure, it may be seen in particular that the transistor structure according to the invention enables a better DIBL factor/coupling factor $\alpha$ compromise to be obtained, at equal channel width, compared to a finFET transistor.

Figure 6:
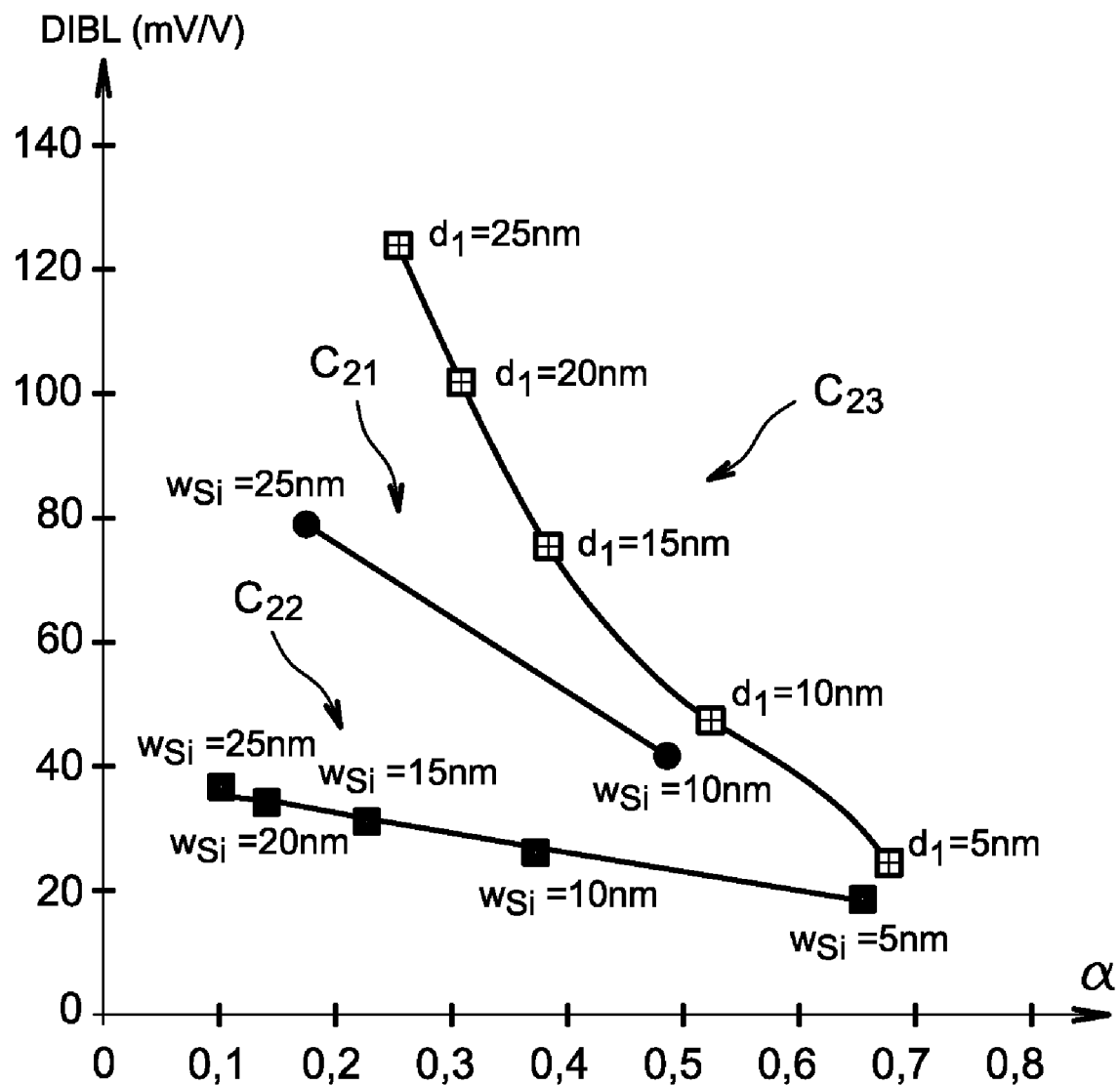
FIG. 6 illustrates, through the intermediary of numerical simulation curves, the performances in terms of DIBL factor/coupling factor couple, for a double-gate transistor device according to the invention, as a function of the width of the semi-conductor rods of its channel structure.

In FIG. 6, examples of curves $C_{21}, C_{22}$ of evolution of the DIBL factor/coupling factor $\alpha$ are given for double-gate transistor structures according to the invention, as described previously in relation to FIG. 2 as a function of the width Wsi of the channel semi-conductor rods, and respectively with dimensions hsi=25 nm and tsi=25 nm, hes=wes=15 nm for curve $C_{21}$ and with hsi=10 nm, hes=wes=4 nm and tsi=10 nm for curve $C_{22}$ (tsi being the semi-conductor rods thickness). By way of comparison, in this FIG. 6 is given an example of curve $C_{23}$ representative of the DIBL factor/coupling factor $\alpha$ couple, for a finFET double-gate transistor structure according to the prior art, as a function of the critical dimension $d_1$ of the channel of this transistor varying between 5 and 25 nanometers and with a height $h_1$ of the channel around 200 nanometers. When the width of the semi-conductor rods of the respective channels of the structure according to the invention as illustrated in FIG. 2 and the structure according to the prior art as illustrated in FIG. 1 are increased, a higher increase of the DIBL for the structure according to the prior art is observed.

For wSi/tSi comprised between 0.5 and 2.5, a coupling higher than $\alpha_0$ can be obtained.

Figure 7:
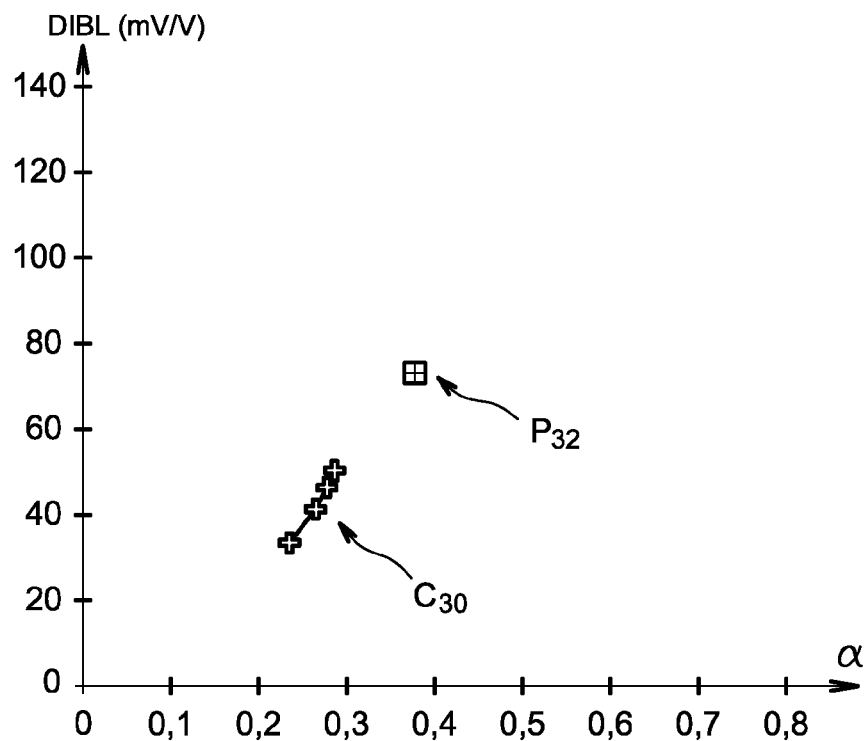
FIG. 7 illustrates, through the intermediary of numerical simulation curves, the performances in terms of DIBL factor/coupling factor couple, for a double-gate transistor device according to the invention, as a function of the height of the semi-conductor rods of its channel structure.

In FIG. 7, an example of curve $C_{30}$ of evolution of the DIBL factor/coupling factor $\alpha$ is given for a double-gate transistor structure according to the invention, as described previously in relation to FIG. 3 as a function of the height hsi of its channel semi-conductor rods, and with dimensions Wsi=15 nm, hes=Wes=7 nm. Curve $C_{30}$ is representative of a height variation between 10 and 25 nanometers of the semi-conductor rods. According to this curve $C_{30}$, the coupling varies little in comparison to the relative variation of DIBL for a height of the semi-conductor rods ranging from 10 to 25 nanometers. The penetration of a portion of gate between the rods assures a better electrostatic control of the channel. By way of comparison, in this same figure, is given an example of measurement point $P_{33}$ representative of the DIBL factor/coupling factor $\alpha$ couple, for a finFET double-gate transistor structure according to the prior art, as a function of the critical dimension $d_1$ of the channel of this transistor and with a height $h_1$ of the channel around 200 nanometers.

Figure 8:
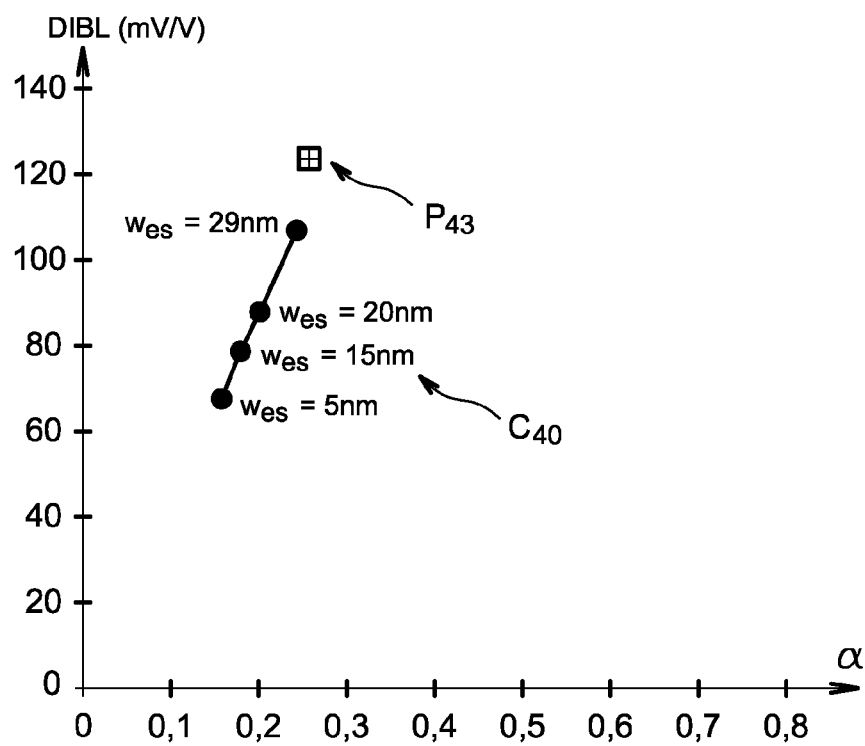
FIG. 8 illustrates, through the intermediary of numerical simulation curves, the performances in terms of DIBL factor/coupling factor couple, for a double-gate transistor device according to the invention, as a function of the width of the insulating rods serving as insulating spacers between the semi-conductor rods of its multi-branch channel vertical structure.

In FIG. 8, an example of curve $C_{40}$ of evolution of the DIBL factor/coupling factor $\alpha$ is given, for a double-gate transistor structure according to the invention, as described previously in relation to FIG. 3, as a function of the width Wes of its insulating rods, and with a height of the insulating rods hes=15 nm, and dimensions of the semi-conductor rods such that hsi=Wsi=25 nm. Curve $C_{40}$ is representative of a height variation between 5 and 29 nanometers. By way of comparison, in this FIG. 8 is given an example of measurement point $P_{43}$ representative of the DIBL factor/coupling factor α couple, for a finFET double-gate transistor structure according to the prior art, as a function of the critical dimension $d_1$ of the channel of this transistor and with a channel height $h_1$ around 200 nanometers.

An example of method according to the invention of forming a microelectronic device and in particular a double-gate and "multi-channel" transistor such as described previously, will now be given in relation to FIGS. 3A-3H.

Firstly, a stacking of thin films is formed on a substrate 100, which may be of semi-conductor on insulator type. The insulating layer 102 of the substrate may be covered with a layer $104_1$, based on a first semi-conductor material. Several other layers $106_1$, $104_2$, $106_2$, $104_3$ are formed on the layer $104_1$ lying on the dielectric layer 102, for example by several successive epitaxies, and form with this said layer a stacking of thin films on the insulating layer 102.

The stacking 105 may be formed of an alternation of layers $104_1$, $104_2$, $104_3$ based on the first material and which will be termed "sacrificial", and layers $106_1$, $106_2$, in which respectively, a transistor channel structure is intended to be formed, and which are based on a second semi-conductor material, different from said first semi-conductor material. The second semi-conductor material and the first semi-conductor material are chosen so that the second semi-conductor material may be selectively etched compared to the first semi-conductor material. The first semi-conductor material may be for example SiGe, or SiGe doped for example by means of phosphorous, whereas the second semi-conductor material may be for example Si. The layers $104_1$, $106_1$, $104_2$, $106_2$, $104_3$ of the stacking may each have a thickness for example between 5 and 70 nanometers.

In the case where the base substrate is silicon on insulator, the layer $104_1$ will be merged with the layer 102.

Figure 3A:
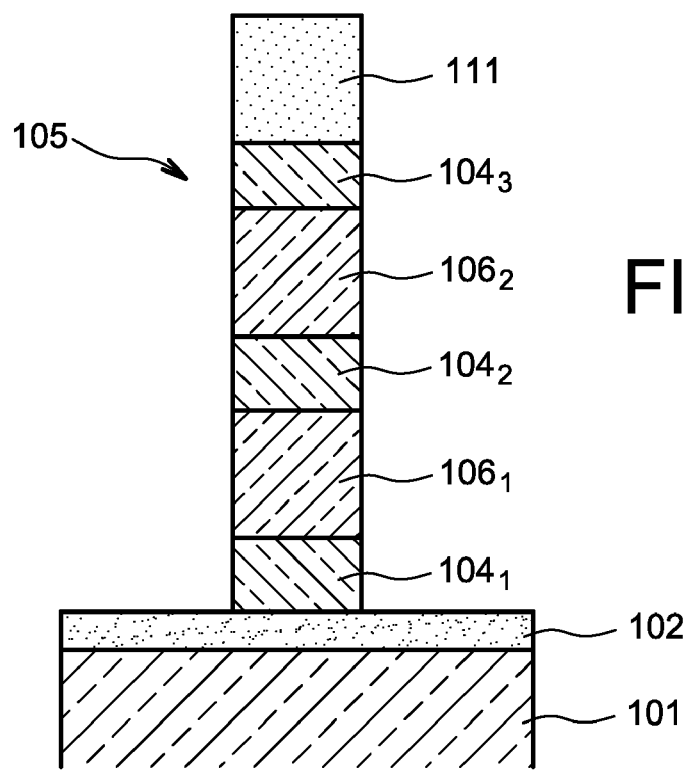
FIGS. 3A to 3H, illustrate an example of microelectronic method according to the invention, for forming a double-gate transistor and equipped with a multi-branch channel.

Once the stacking has been formed, the layers $104_1$, $106_1$, $104_2$, $106_2$, of said stacking are etched so as to form at least one structure 120 of superimposed semi-conductor rods, based on the first semi-conductor material and the second semi-conductor material. In the structure 120, at least one multi-channel structure for transistor is intended to be formed. The structure 120 may also link a first block etched in the stacking and intended to form a drain region of the transistor and a second block etched (the first block and the second block not being represented) in the stacking and intended to form a source region of the transistor. The etching may be carried out by means of a hard mask 111 that forms at least one channel shape pattern and may also form a source region pattern and a drain region pattern. The hard mask 111 may be based on a dielectric material such as for example $Si_3N_4$. The etching of the stacking may be of anisotropic type, and carried out for example by means of a plasma based on $CH_2F_2+HeO_2+CF_4$ for a SiN etching and $HBr+Cl+HeO_2$ for a selective etching of Si or SiGe through the insulating hard mask 111 based on $Si_3N_4$ (FIG. 3A).

In the case where the base substrate is silicon on insulator, the layer $104_1$, merged with the layer 102 in silica, may for example be etched by a solution based on HF and/or during the previous anisotropic plasma etching.

Then, the rods $104_1$, $104_2$, $104_3$, based on the first semi-conductor material are removed, by selective etching with regard to the second semi-conductor material. The rods $106_1$, $106_2$, based on the second semi-conductor material and situated in the cavity are for their part conserved. The removal of the first semi-conductor material may be carried out by means for example of an isotropic etching based on $CF_4+O_2$ plasma. Following the removal of the first semi-conductor material in the cavity, separate semi-conductor rods based on the second semi-conductor material and linking the source region block and the drain region block are formed.

Figure 3B:
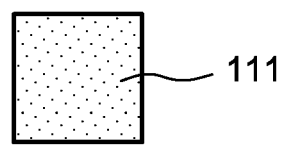
Figure 3B:
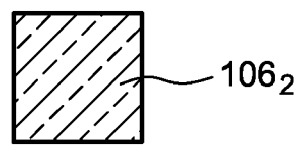
Figure 3B:
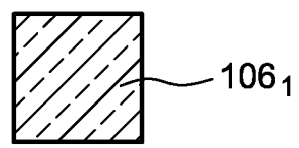
Figure 3B:
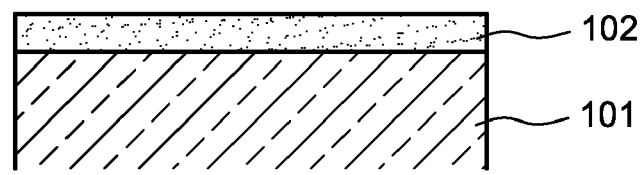
Figure 3C:
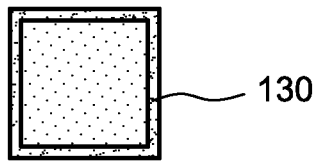
Figure 3C:
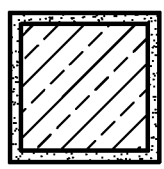
Figure 3C:
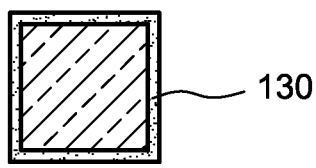
Figure 3D:
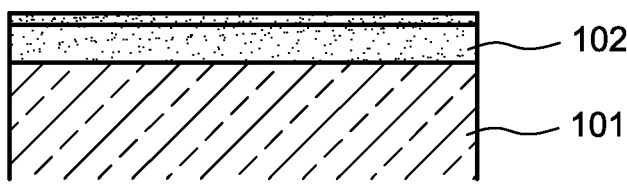
Figure 3D:
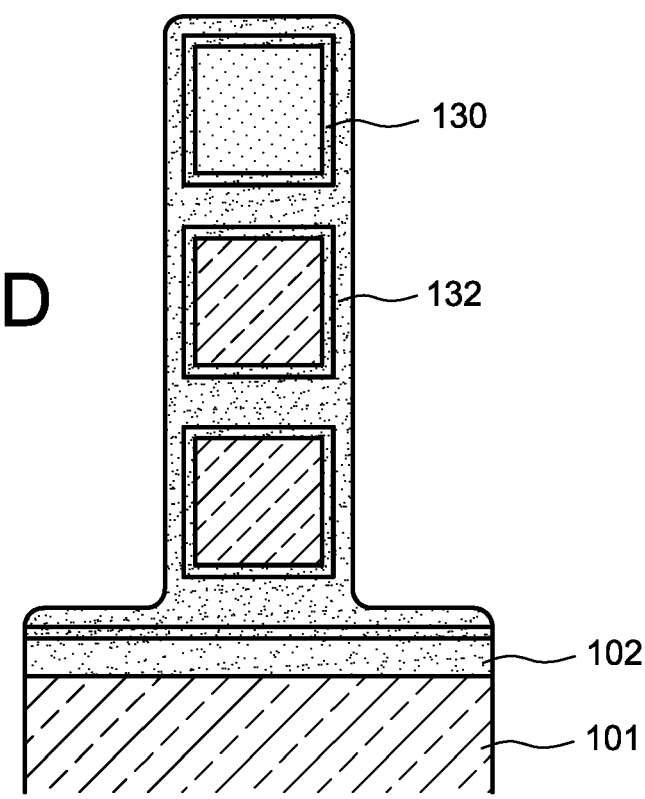
Figure 3E:
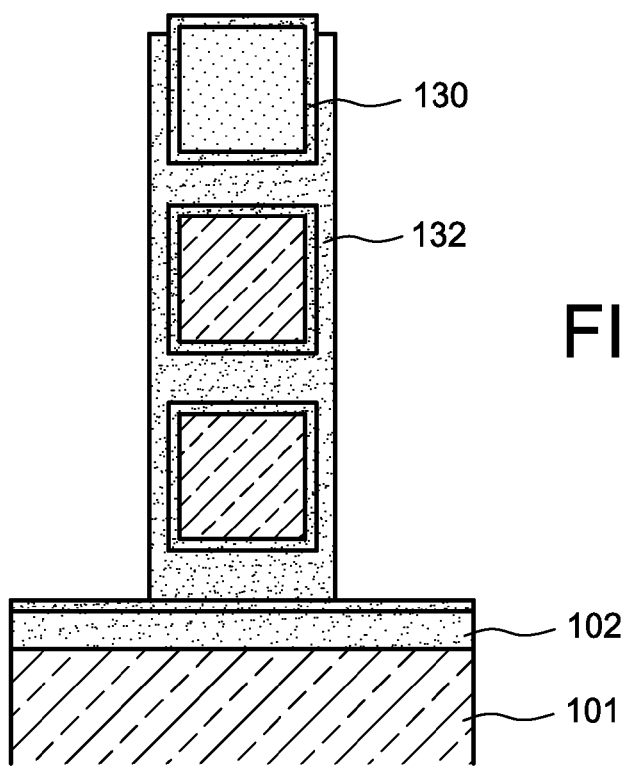

The rods $106_1$, $106_2$, are parallel to each other and situated in a plane orthogonal or substantially orthogonal to the principal plane of the substrate, with the principal plane of the support layer 101 or the dielectric layer 102 of the substrate 100 (FIG. 3B).

Then (FIG. 3C), the periphery of the rods is covered by means of a first dielectric material 130, for example $SiO_2$ of HTO type (HTO for "High Thermal Oxide"), in order to protect the rods $106_1$, $106_2$, during a subsequent etching step.

Figure 3F:
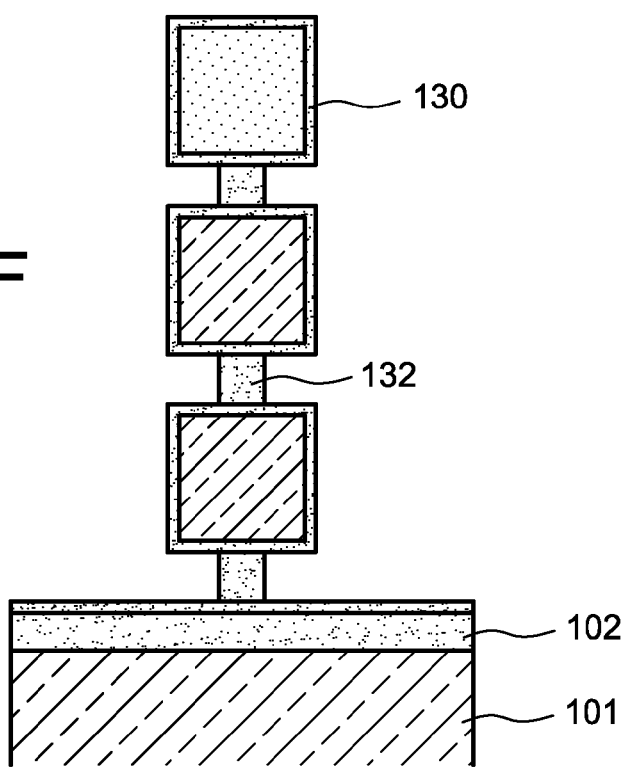
Figure 3G:
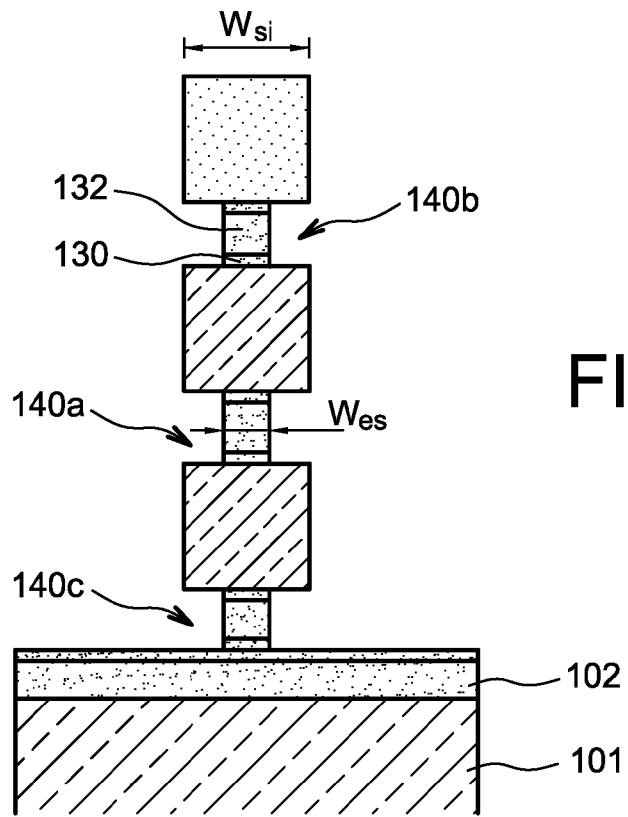
Figure 3H:
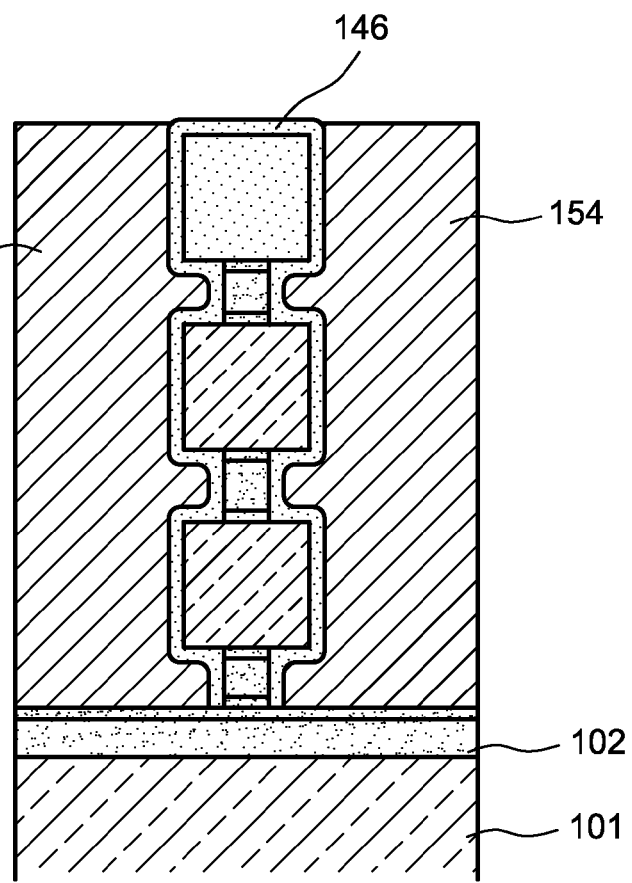

Then (FIG. 3D), a second dielectric material 132 is deposited, so as to cover the structure 120 and fill the spaces between the rods $106_1$, $106_2$. The second dielectric material 132 may be for example $Si_3N_4$. The second dielectric material 132 is then removed, so as to conserve this material uniquely between the rods. This removal may be achieved firstly by means of a first anisotropic etching (FIG. 3E) of the second dielectric material, preferably selective with regard to the first dielectric material, for example by means of $CF_4$/HBr. Then, an isotropic etching of the second dielectric material may be carried out. This isotropic etching is selective with regard to the first dielectric material, and may be carried out for example by means of $SF_6$/HBr. The etching is carried out so as to partially remove the second dielectric material 132 between the rods $106_1$, $106_2$ (FIG. 3F).

Then, a removal of the first dielectric material 130 is carried out, so as to conserve this material between the rods $106_1$, $106_2$. This removal may be carried out for example by cleaning by means of HF.

The above mentioned steps of removing the first dielectric material 130 and the second dielectric material 132 are carried out so as to conserve the insulating rods 140a, 140b, 140c, also known as insulating spacers between the semi-conductor rods $106_1$, $106_2$. The insulating spacers 140a, 140b, 140c based on the first dielectric material 130 and the second dielectric material 132 are formed so as to have a predetermined critical dimension Wes, less than the critical dimension Wsi of the semi-conductor rods $106_1$, $106_2$. The critical dimension Wes of the insulating rods 140a, 140b, 140c, and that Wsi of the semi-conductors rods $106_1$, $106_2$, may be provided at least as a function of a DIBL factor that it is wished not to exceed and a coupling factor α that it is wished to confer on the transistor structure.

A double-gate may then be formed, for example by filling the cavity by means of a Damascene type method. To form this double-gate, a deposition of a dielectric material 146 is carried out on the structure 120. This deposition may be standard, and based for example on material of type commonly known as "high-k" such as $HfO_2$, of thickness for example between 1 and 10 nanometers. Then, a deposition of one or several gate materials is carried out, on either side of the structure 120, in the cavity. Polysilicon may be deposited for example, so as to fill the cavity. In the case where the filling is carried out so that the gate material covers the top of the structure and in particular the first insulating layer 132, a CMP (CMP for "chemical mechanical polishing") step may be provided in order to only conserve the gate material 148, in the cavity up to the level of the opening of said cavity. The polishing may be carried out with a stop on the hard mask 111 if appropriate covered with the first dielectric layer 130. After polishing, the device comprises a first zone 152 based on gate material, situated on one side of the structure 120 and intended to form a first gate or a first electrode of a double-gate, as well as second zone 154 based on gate material, situated on the other side of the structure 120, and intended to form a second gate or a second electrode of a double-gate. The zones 152 and 154 are separate. The insulating spacers 140a, 140b, 140c enable the first gate to be insulated from the second gate, and are formed with a critical dimension Wes less than the critical dimension Wsi of the semi-conductor rods $106_1$, $106_2$, the gate material penetrating underneath a part of the semi-conductor rods $106_1$, $106_2$.

The invention claimed is:

1. Double gate transistor microelectronic device comprising:
    a support,
    a structure suited to forming at least one multi-branch channel and comprising a plurality of separate parallel semi-conductor rods having a longitudinal direction parallel to a principal plane of the support and situated in a plane orthogonal to the principal plane of the support, the semi-conductor rods linking in said longitudinal direction a first block suited to form a source region of the transistor and a second block suited to form a drain region of the transistor,
    a first gate electrode situated on one side of said structure adjacent lateral sides of said semi-conductor rods,
    a second gate electrode, separate from the first gate and situated on another side of the structure adjacent opposite lateral sides of the semi-conductor rods, wherein the semi-conductor rods, and one or several insulating rods having a longitudinal direction parallel to said longitudinal direction of said semi-conductor rods and situated between the semi-conductor rods, separate the first gate electrode and the second gate electrode, the insulating rods having a width Wes less than a width Wsi of the semi-conductor rods,
    wherein a ratio between the width Wsi of the semi-conductor rods and the width Wes of the insulating rods is so as to confer to said microelectronic device a DIBL factor inferior to a predetermined maximum threshold $DIBL_{max}$ and/or so as to confer to said microelectronic device at least one coupling factor between the two gate electrodes, superior to a predetermined minimum coupling factor $\alpha_0$.

2. Microelectronic device according to claim 1, wherein the insulating rods have a critical dimension Wes between 0.2*Wsi and Wsi, wherein Wsi is the critical dimension of the semi-conductor rods.

3. Microelectronic device according to claim 2, the semi-conductor rods have a critical dimension Wsi and a thickness tsi such that $w_{Si}/t_{Si}$ is comprised between 0.5 and 2.5.

4. Microelectronic device according to claim 3, wherein the semi-conductor rods have a critical dimension between 5 and 100 nm.

5. Microelectronic device according to claim 4, wherein the first gate electrode and the second gate electrode are moreover separated by a block of insulating masking, lying on said multi-branch channel structure.

6. Microelectronic device according to claim 5, wherein at least one insulating rod separates the semi-conductor rods of the support.

7. Microelectronic device according to claim 1, wherein the predetermined maximum threshold $DIBL_{max}$ is 100 mV/V and the predetermined minimum coupling factor $\alpha_0$ is 0.15.

8. Microelectronic device according to claim 1, wherein at least one of the one or several insulating rods is situated between the semi-conductor rods by being above a respective first semi-conductor rod and below a respective second semi-conductor rod, wherein the respective first semi-conductor rod and the respective second semi-conductor rod are adjacent each other in the plurality of separate parallel semi-conductor rods.

9. Double gate transistor microelectronic device comprising:
    a support,
    a structure suited to forming at least one multi-branch channel and comprising a plurality of separate parallel semi-conductor rods having a longitudinal direction parallel to a principal plane of the support and situated in a plane orthogonal to the principal plane of the support, the semi-conductor rods linking in said longitudinal direction a first block suited to form a source region of the transistor and a second block suited to form a drain region of the transistor,
    a first gate electrode situated on one side of said structure adjacent sides of said semi-conductor rods,
    a second gate electrode, separate from the first gate and situated on another lateral side of the structure adjacent opposite lateral sides of the semi-conductor rods, wherein the semi-conductor rods, and one or several insulating rods having a longitudinal direction parallel to said longitudinal direction of said semi-conductor rods and situated between the semi-conductor rods, separate the first gate electrode and the second gate electrode, the insulating rods having a width Wes less than a width Wsi of the semi-conductor rods.

10. Microelectronic device according to claim 9, wherein a ratio between a critical dimension Wsi of the semi-conductor rods and a critical dimension Wes of the insulating rods is so as to confer to said microelectronic device a DIBL factor inferior to a predetermined maximum threshold $DIBL_{max}$ and/or so as to confer to said microelectronic device at least one coupling factor between the two gate electrodes, superior to a predetermined minimum coupling factor $\alpha_0$.

11. Microelectronic device according to claim 10, wherein the predetermined maximum threshold $DIBL_{max}$ is 100 mV/V and the predetermined minimum coupling factor $\alpha_0$ is 0.15.

12. Microelectronic device according to claim 9, wherein at least one of the one or several insulating rods is situated between the semi-conductor rods by being above a respective first semi-conductor rod and below a respective second semi-conductor rod, wherein the respective first semi-conductor rod and the respective second semi-conductor rod are adjacent each other in the plurality of separate parallel semi-conductor rods.

* * * * *

UNITED STATES PATENT AND TRADEMARK OFFICE
CERTIFICATE OF CORRECTION

PATENT NO. : 8,288,823 B2
APPLICATION NO. : 12/238794
DATED : October 16, 2012
INVENTOR(S) : Thomas Ernst et al.

Page 1 of 1

It is certified that error appears in the above-identified patent and that said Letters Patent is hereby corrected as shown below:

On the Title page in the Assignee Item (73) please insert therefor --Institut National Polytechnique De Grenoble, Grenoble (FR)--

Signed and Sealed this
Third Day of September, 2013

Teresa Stanek Rea
*Acting Director of the United States Patent and Trademark Office*